United States Patent
Saracco et al.

(10) Patent No.: US 8,349,667 B2
(45) Date of Patent: Jan. 8, 2013

(54) METHOD FOR STABILIZING GERMANIUM NANOWIRES OBTAINED BY CONDENSATION

(75) Inventors: Emeline Saracco, Grenoble (FR); Jean-Francois Damlencourt, Laval (FR); Thierry Poiroux, Voreppe (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 341 days.

(21) Appl. No.: 12/875,729

(22) Filed: Sep. 3, 2010

(65) Prior Publication Data

US 2011/0059598 A1  Mar. 10, 2011

(30) Foreign Application Priority Data

Sep. 10, 2009  (FR) ..................... 09 04321

(51) Int. Cl.
*H01L 21/336* (2006.01)
(52) U.S. Cl. ........ 438/150; 438/149; 438/199; 438/480; 977/855; 257/E21.123
(58) Field of Classification Search .......... 438/149–150, 438/197, 199, 479–480; 257/E21.123; 977/855–859
See application file for complete search history.

(56) References Cited

U.S. PATENT DOCUMENTS
2008/0135949 A1* 6/2008 Lo et al. .............. 257/401

FOREIGN PATENT DOCUMENTS
WO WO 2008/069765 A1 6/2008
WO WO 2009/072984 A1 6/2009

OTHER PUBLICATIONS

Saracco et al., "Fabrication of Suspended Ge-rich Nanowires by Ge Enrichment Technique for Multi-channel Devices," *ECS Transactions*, vol. 19, No. 1, pp. 207-212, 2009.

* cited by examiner

*Primary Examiner* — Thanhha Pham
(74) *Attorney, Agent, or Firm* — Oliff & Berridge, PLC

(57) ABSTRACT

The substrate comprises a first silicon layer, a target layer made from silicon-germanium alloy-base material forming a three-dimensional pattern with first and second securing areas and at least one connecting area. The first silicon layer is tensile stressed and/or the target layer contains carbon atoms. The first silicon layer is eliminated in the connecting area. The target layer of the connecting area is thermally oxidized so as to form the nanowire. The lattice parameter of the first silicon layer is identical to the lattice parameter of the material constituting the suspended beam, after said first silicon layer has been eliminated.

10 Claims, 6 Drawing Sheets

METHOD FOR STABILIZING GERMANIUM NANOWIRES OBTAINED BY CONDENSATION

BACKGROUND OF THE INVENTION

The invention relates to a method for forming at least one suspended nanowire made from germanium-base single-crystal material, a method successively comprising:
  providing a substrate comprising a first silicon layer covered by a target layer made from a silicon-germanium alloy-base material,
  forming at least one suspended beam in the target layer,
  oxidizing thermally the suspended beam so as to form said nanowire, in the place of the suspended beam, by condensation of the germanium atoms.

STATE OF THE ART

Continued improvement of the performances of microelectronic circuits requires the integration density of the individual components of the circuits to be increased. Up to now, performance improvement was achieved by continuous miniaturization of the MOSFET transistor dimensions. Transistors are now of nanometric size and numerous technological difficulties are encountered in producing them. Quantum effects within the field-effect transistor are no longer negligible and conventional microelectronics materials are no longer able to provide characteristics meeting the required specifications. Alternative solutions are therefore being proposed to be able to continue improving the performances of microelectronic circuits.

One of the most promising ways forward consists in using nano-objects and more precisely semiconducting nanowires. Nanowires can be used to form single-crystal channels of field-effect MOS transistors.

The article by Saracco et al., "Fabrication of suspended Ge-rich nanowires by Ge condensation technique for multi-channel devices" ECS transaction May 2009 San Francisco, describes a method for fabricating nanowires made from semiconducting material. These germanium-rich nanowires are fabricated from condensation of a silicon-germanium alloy film that is subjected to thermal oxidation. During this thermal oxidation, the silicon atoms contribute to formation of a silicon oxide and the germanium atoms are repelled from the oxide. In this way, the germanium atoms not consumed by formation of the silicon oxide condense in a silicon-germanium layer rich in germanium or even in a layer of pure germanium.

In this embodiment, illustrated in FIG. 1, a silicon-germanium alloy target layer 1 is formed on the silicon surface of a silicon-on-insulator substrate 2. Substrate 2 comprises a first silicon layer 3 separated from support substrate 4 by a buried dielectric 5. Silicon-germanium alloy target layer 1 is covered by a second silicon layer 6 and a second silicon-germanium alloy target layer 7.

As illustrated in FIG. 2, silicon-germanium alloy target layers 1 and 7 and silicon layers 3 and 6 are etched. Then, as illustrated in FIG. 3, silicon layers 3 and 6 are eliminated so that the silicon-germanium alloy layers form suspended beams above the substrate. These suspended beams 1 and 7 then undergo thermal oxidation so as to achieve condensation of the germanium atoms into germanium-rich nanowires 8 (FIG. 4). At the end of thermal oxidation, nanowires 8 are surrounded by a silicon oxide layer 9.

This fabrication method presents numerous advantages, in particular that of enabling one or more nanowires to be made from a semi-conductor material in simple manner. However it is rare to observe germanium-base nanowires that present the required electric characteristics. It is also difficult to obtain circuits presenting as low a percentage of non-functional circuits as compared with a conventional technology.

OBJECT OF THE INVENTION

The object of the invention is to provide a method that reduces or even eliminates nanowire deformation phenomena while at the same time preserving fabrication of germanium-rich nanowires that is easy to implement.

The method according to the invention is characterized in that the first silicon layer is tensile stressed in a plane parallel to the main surface of the substrate and/or the target layer comprises carbon atoms so that, in a plane parallel to the main surface of the substrate, after the first silicon layer has been eliminated, the lattice parameter of the material constituting the target layer is identical to the lattice parameter of said first silicon layer.

BRIEF DESCRIPTION OF THE DRAWINGS

Other advantages and features will become more clearly apparent from the following description of particular embodiments of the invention, given for non-restrictive example purposes only and represented in the accompanying drawings, in which.

DESCRIPTION OF A PREFERRED EMBODIMENT OF THE INVENTION

Figure 1:
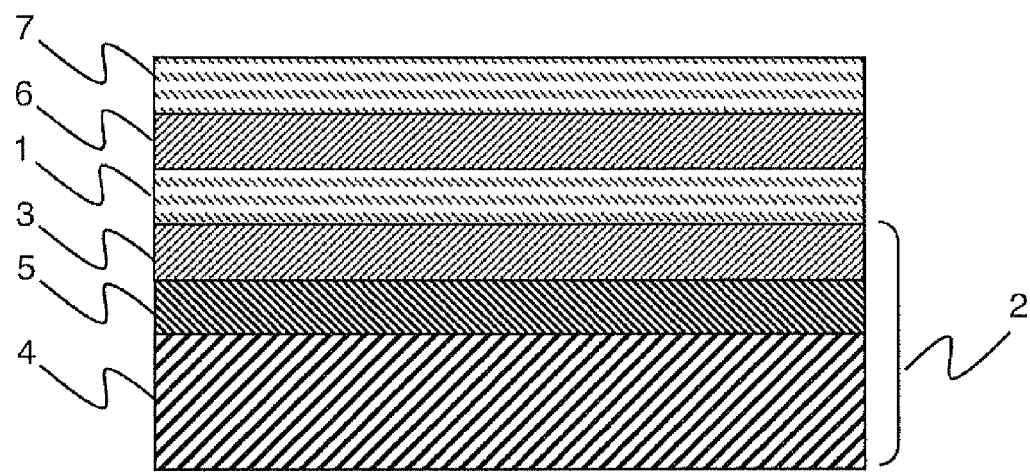
FIGS. 1 to 4 represent different steps of a fabrication method according to the prior art in schematic manner, in transverse cross-section.
Figure 2:
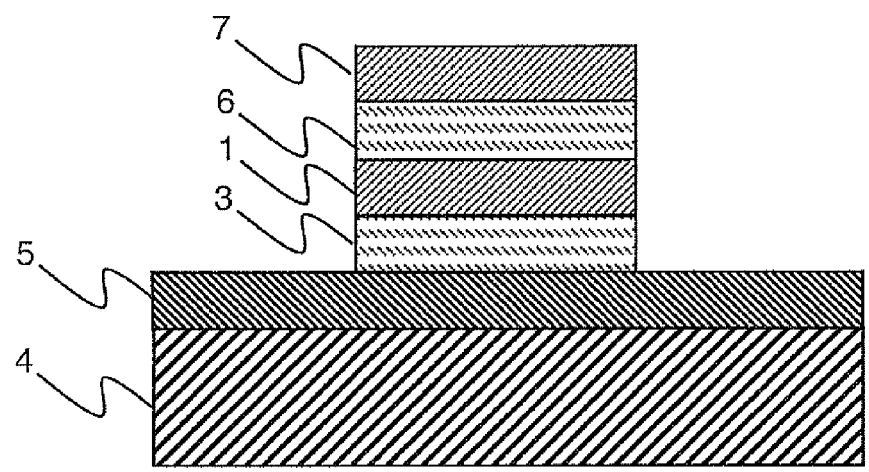
Figure 3:
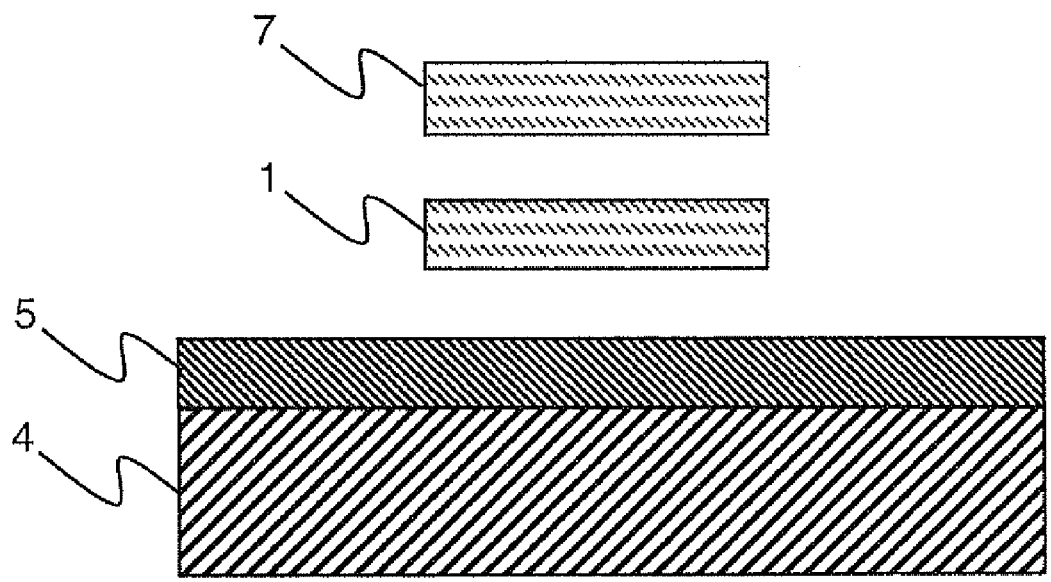
Figure 4:
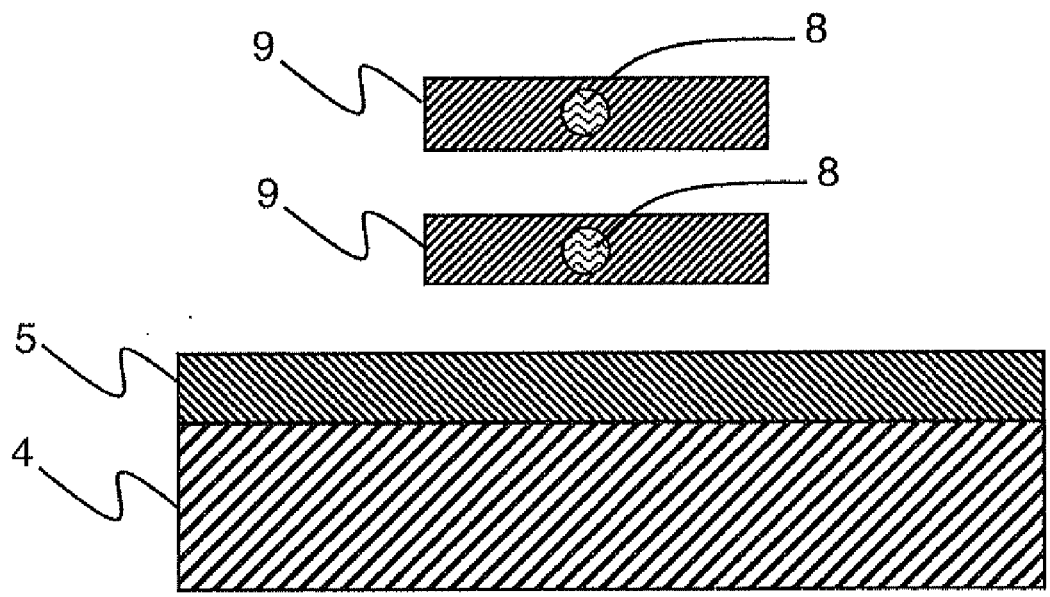
Figure 5:
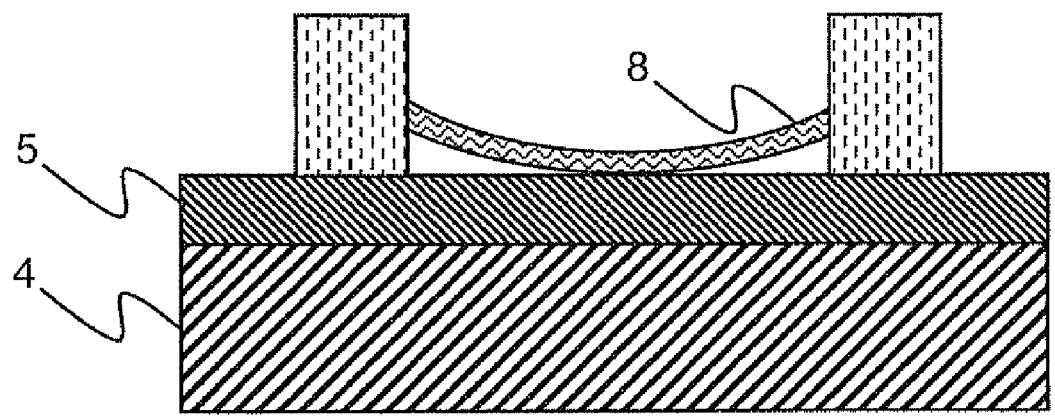
FIG. 5 represents a deformed nanowire in schematic manner, in transverse cross-section.

As illustrated in FIG. 5, it has been discovered that germanium-base nanowires, produced for example according to the method described by Saracco et al. referred to above, are subject to deformation. The deformed nanowires can thereby be in contact with other nanowires and/or other elements of the substrate. It has also been observed that when nanowires are formed, the suspended beams are also deformed, which can also explain the difficulties encountered in obtaining electronic circuits having as high efficiencies as circuits fabricated using conventional technologies.

Figure 6:
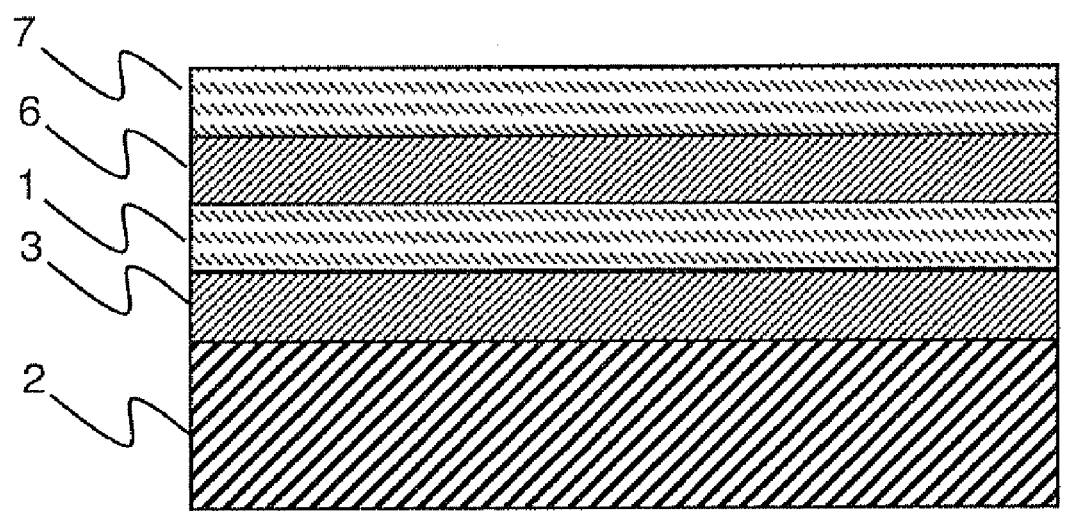
FIGS. 6, 7, 9 and 10 represent different steps of a fabrication method according to the invention in schematic manner, in transverse cross-section.

A main surface of a substrate 2 is successively covered by at least a first silicon layer 3 and a silicon-germanium alloy-base target layer 1, first silicon layer 3 being directly covered by target layer 1. As illustrated in FIG. 6, as an alternative embodiment, this stack can be covered by at least one additional silicon layer 6 and one additional target layer 7. It is also possible to form a plurality of additional target layers and additional silicon layers above first silicon layer 3 and target layer 1. However, there has to be an alternation between target layers 1 and 7 and silicon layers 3 and 6. Each target layer is made from silicon-germanium alloy and therefore at least mostly comprises silicon and germanium atoms. The target layer can also comprise other atoms such as for example boron, phosphorus, arsenic or carbon atoms. Target layers 1 and 7 and silicon layers 3 and 6 are single-crystal layers and are in lattice agreement with first silicon layer 3.

Substrate 2 can be a bulk substrate or a semiconductor-on-insulator substrate. First silicon layer 3 can form an integral part of substrate 2 or it can be formed on the main surface of substrate 2. First silicon layer 3 can therefore be made from a different material from that constituting substrate 2. In the case of a silicon-on-insulator substrate, first silicon layer 3 can be arranged directly on the dielectric material layer above the support substrate.

Substrate 2 and the formed layers are then subjected to a series of technological steps in order to form at least one suspended beam in target layer 1, here in each target layer 1 and 7. This suspended beam is joined to substrate 2 via its ends whereas its central part is free.

Figure 7:
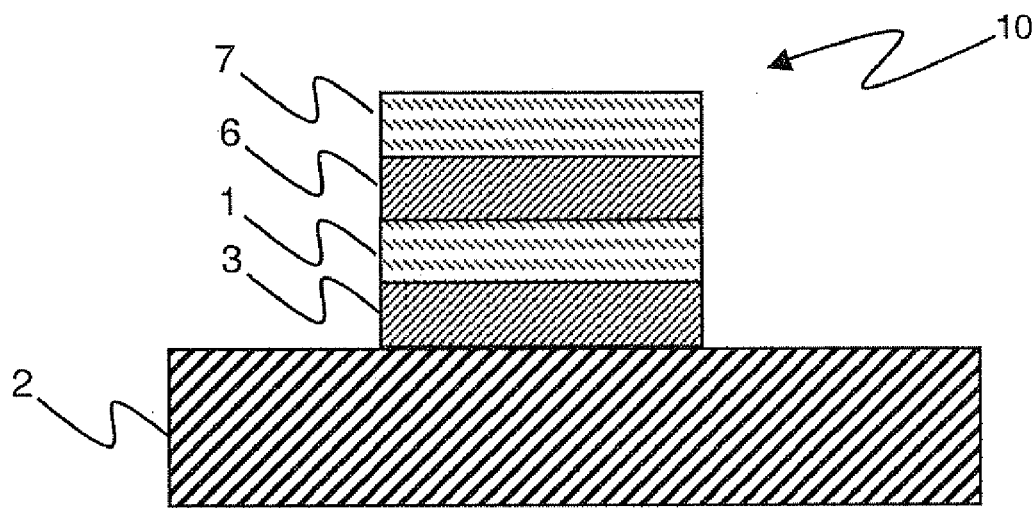

As illustrated in FIG. 7, first silicon layer 3, silicon-germanium alloy target layer 1 and additional layers 6 and 7 are patterned such as to allow access to silicon layer 3 from the side. Advantageously, the etching method is highly anisotropic so that the three-dimensional pattern presents vertical flanks. However, an etching method that also presents an isotropic etching component for the silicon only is not disadvantageous.

Etching of the layers arranged at the surface of substrate 2 can be performed by any suitable technique, for example by photolithography and etching. This etching can also be performed by means of a hard mask (not shown) that is previously patterned and that will act as model for patterning target layers 1 and 7 and silicon layers 3 and 6 in FIG. 7.

Figure 8:
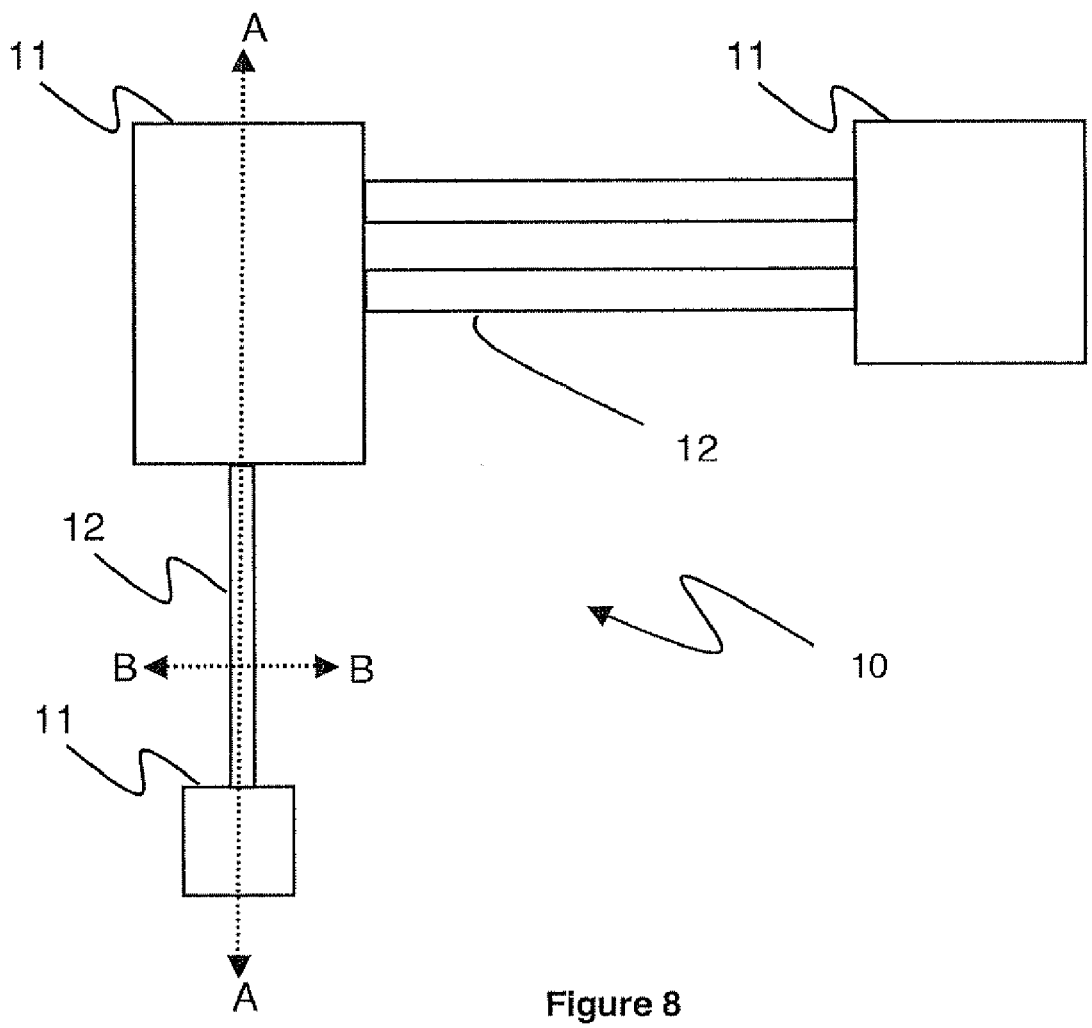
FIG. 8 represents a three-dimensional pattern corresponding to FIG. 7, according to the invention in schematic manner, in top view.

As illustrated in FIG. 8, in an advantageous embodiment, the layers present (1, 7, 3 and 6) are patterned so as to form a three-dimensional pattern. Three-dimensional pattern 10 presents a particular form in top view or in a plane parallel to the main surface of the substrate. Three-dimensional pattern 10 comprises at least two securing areas 11 that are connected to one another by at least one connecting area 12. The three-dimensional pattern can comprise a plurality of connecting areas 12 connecting a plurality of securing areas 11 to form an electronic circuit. It is possible for two securing areas 11 to be connected to one another by more than one connecting area 12, for example two connecting areas 12 as in FIG. 8. It can also be envisaged for a securing area 11 to be connected to several other securing areas 11 by means of one or more connecting areas (FIG. 8).

Connecting area 12 comprises a longitudinal direction and a transverse direction. In FIG. 8, the longitudinal direction is represented by direction AA whereas the transverse direction is represented by direction BB. Securing areas 11 are arranged at each end of the connecting area in the longitudinal direction. Securing areas 11 also present longitudinal and transverse directions. In its transverse direction, connecting area 12 presents a width dimension that is smaller than the dimensions of the securing area in the longitudinal and transverse directions. In this case, securing areas 11 and the connecting area are formed by the same materials.

The width and length of securing area 11 are thus always greater than the width of connecting area 12. In the case where the transverse dimensions of the connecting areas are not constant within a connecting area 12 and/or between different connecting areas 12, the largest width present on the surface of the substrate has to be taken into account to define the minimum dimension (transverse and longitudinal) of securing areas 11.

It is also possible to pattern the layers present so as to only form connecting area 12 and to form securing areas 11 afterwards. These securing areas can be formed for example from a metallic material or from materials that are insensitive to the subsequent technological steps. Advantageously, once the connecting area has been formed, the silicon layers are selectively etched over a small thickness at least in the areas in contact with the future securing areas 11. When securing area 11 is formed, the ends of the silicon-germanium alloy films are thereby sunk in the securing area.

Figure 9:
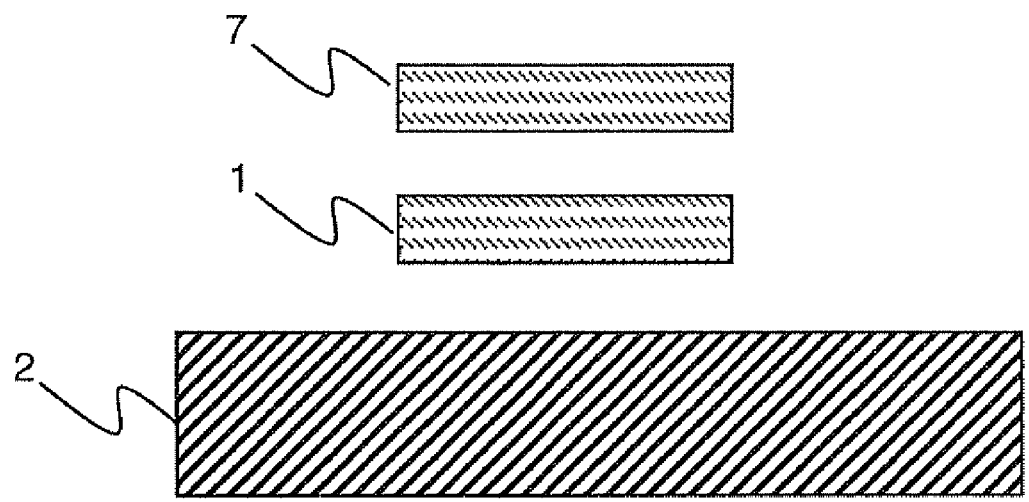

As illustrated in FIG. 9, in a cross-section of a connecting area 12 in the transverse direction BB, once three-dimensional pattern 10 has been formed, silicon layers 3 and 6 are eliminated in connecting areas 12. This results in target layers 1 and 7 forming suspended bridges above substrate 2. The suspended bridges of target layers 1 and 7 are held secured above the substrate by means of securing areas 11 which are arranged on each side of the bridges.

Elimination of the silicon layers is performed by means of selective etching between the silicon and the silicon-germanium alloys present. Etching can be performed by means of plasma etching, gaseous hydrochloric acid etching or wet etching. As this etching is isotropic, etching of the silicon layers present in securing areas 11 can also take place. The etching times are therefore chosen so as to ensure that the bridges are freed while at the same time preserving the integrity of securing areas 11. Etching of silicon layers 3 and 6 in connecting areas 12 is performed from the side faces of the connecting area. The transverse and longitudinal dimensions of securing areas 11 are also chosen so as to ensure a certain margin in the etching process of the silicon layers of connecting area 12 with respect to securing areas 11.

After silicon layers 3 and 6 have been eliminated in connecting area 12 to form suspended bridges in target layers 1 and 7, there is no longer any stress exerted by substrate 2 on suspended bridges. This then results in the materials of the suspended bridges being able to relax the stresses they contained which is generally expressed by deformation of the beams, typically buckling of the latter. In order to prevent this deformation phenomenon, the characteristics of first silicon layer 3 and/or of target layers 1 and 7 are modified. Their chemical composition and/or their fabrication method can be modified. In so far as target layer 1 and additional target layer 7 are made from silicon-germanium alloys which present a higher lattice parameter in relaxed state than the lattice parameter of silicon, a means has to be found to make these lattice parameters correspond to what is imposed by the substrate, i.e. by first silicon layer 3.

In a general manner, to prevent the suspended beam from deforming by buckling, the lattice parameter of the material forming the beam has to present the same lattice parameter in relaxed state as first silicon layer 3. The distance between securing areas 11 being constant, an increase of the in lattice parameter of the beam results in an increase of the length of the beam and therefore deformation of the latter. The lattice parameter of first silicon layer 3, in a plane parallel to the main surface of substrate 2, therefore has to be identical to the lattice parameter of the material forming the suspended beam, after said first silicon layer 3 has been eliminated.

In a first embodiment, first silicon layer 3 is tensile stressed in a plane parallel to the main surface of the substrate. Under the effect of this stress, the lattice parameter of first silicon layer 3, in a plane parallel to the main surface of the substrate, is greater than in its relaxed (unstressed) state. The lattice parameter is then identical to that of a particular silicon-germanium alloy. In conventional manner, it is possible to fabricate tensile-stressed silicon films stressing of which enables a silicon film to be obtained having a lattice parameter that is equivalent to that of a silicon-germanium alloy containing up to 30% of germanium. These films are commonly called 30% tensile-stressed silicon films. By adjusting the stress applied to first silicon layer 3 and the germanium concentration of target layers 1, 7, there can be an identity of the lattice parameters between the different layers. The lattice parameters in relaxed state being identical in the plane parallel to the main surface of the substrate, there is no stress field between the two materials, which prevents the buckling phenomenon by stress relaxation.

In this first embodiment, first silicon layer 3 can come from a substrate of stressed silicon-on-insulator type or be formed on a relaxed germanium or silicon-germanium substrate which imposes deformation of the crystal lattice of the silicon of layer 3. In the case of a substrate of stressed silicon-on-insulator type, first silicon layer 3 is directly arranged on a dielectric material layer.

In a second mode embodiment, carbon atoms are incorporated in target layer 1, 7 which is made from silicon-germanium-carbon alloy. Whereas the germanium atoms have the effect of increasing the lattice parameter of the silicon-germanium alloy in a substantially proportional manner with the germanium atom concentration, the carbon atoms have an opposite effect on the lattice parameter. Thus, as the carbon concentration increases, the lattice parameter of the silicon-germanium-carbon alloy decreases, the germanium is concentration being constant. In this way, by adjusting the germanium and carbon concentrations, an alloy of SiGeC type can be obtained that presents a lattice parameter identical to that of silicon in the unstressed state. In conventional manner, maximum carbon concentrations of about 2% can be achieved by epitaxy. A SiGeC alloy can therefore be obtained containing 20% germanium, 2% carbon and which presents the same lattice parameter as silicon. As carbon has a ten times greater effect than germanium on the lattice parameter, the silicon-germanium-carbon alloys contain a ten times greater germanium concentration than the carbon concentration in order to have a lattice parameter identical to that of unstressed silicon.

In this second embodiment, first silicon layer 3 can come from a substrate of silicon-on-insulator type or be the top part of a bulk silicon substrate. Advantageously, integration from a silicon-on-insulator substrate is implemented if the nanowires are to be used to form a CMOS circuit.

If more than one target layer is made on the substrate, for example a target layer 1 and an additional target layer 7, it is possible for these two layers not to have the same germanium and carbon concentrations. They do however present the same lattice parameter.

These two embodiments can be combined and it is thereby possible to integrate a target silicon-germanium-carbon alloy layer on a first stressed silicon layer. The SiGeC alloy can contain a larger quantity of germanium so that the compensation of the lattice parameter made by the carbon matches the lattice parameter of first stressed silicon layer 3.

The modification made to target layers 1, 7 and/or to first silicon layer 3 enable the stress fields that exist between these layers to be limited or even eliminated. Thus, in connecting area 12, in a plane parallel to the main surface of the substrate, the lattice parameter of target layer 1 and of additional target layer 7 is preserved before and after and elimination of silicon layers 3 and 6. This lattice parameter corresponds to that of first silicon layer 3.

Figure 10:
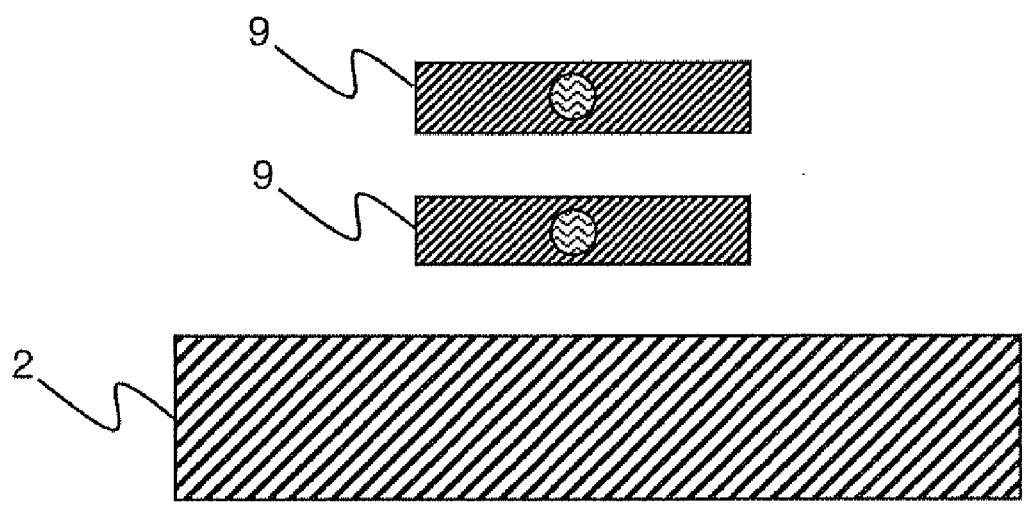

As illustrated in FIG. 10, once the suspended beams have been formed in target layers 1 and 7, the suspended beams undergo thermal oxidation. This thermal oxidation will result in condensation of the germanium and form a germanium-base suspended nanowire 8, i.e. a nanowire made from pure germanium or from a silicon-germanium alloy rich in germanium. Advantageously, the germanium concentration in the target layers is about 30% and the germanium concentration in the nanowire is comprised between 50% and 80%. Germanium-base nanowire 8 then presents an identical longitudinal direction to that of suspended beam 1, 7 inside which it is formed. The nanowire formed in this way is therefore made from a crystalline semi-conductor material that essentially comprises germanium atoms. When thermal oxidation is performed, each suspended beam is therefore replaced by a nanowire 8 by condensation of the germanium atoms.

During the oxidation step, selective oxidation of the silicon atoms takes place to form a silicon oxide. As the germanium atoms do not participate in formation of the oxide, they are not incorporated in the silicon oxide and are kept out of the silicon oxide. Oxidation being performed by addition of oxygen atoms on the lateral surfaces of connecting areas 12, the germanium atoms are repelled to the inside of target layer 1, 7 with the progression of the interface between silicon oxide 9 and the silicon-germanium alloy. When condensation takes place, there is a continuous enrichment of the silicon-germanium alloy in germanium atoms and transformation of a semi-conductor material of parallelepipedic shape into a semi-conductor material of cylindrical shape. The germanium concentration of nanowire 8 is thus greater than the germanium concentration in the corresponding target layer.

When connecting area 12 comprises several target layers 1, 7, there is formation of one nanowire 8 per target layer. Thus, as illustrated in FIG. 10, target layers 1 and 7 enable formation of two distinct nanowires 8.

The size of nanowire 8, typically its diameter, depends on the dimensions of the initial suspended bridge, the thickness and width of the latter. Thus, if target layers 1 and 7 present different thicknesses and an identical width, the resulting nanowires will have different diameters. The diameter of nanowire 8 also depends on the duration and conditions of the thermal oxidation step. The thicker the oxide formed, the thinner the nanowire will be compared with the initial dimensions of the suspended beam.

In the case where nanowires 8 are made from pure germanium, it is also possible to modulate the thickness of nanowires 8 by modulating only the germanium concentration between the different silicon-germanium alloy target layers 1, 7. It is also possible to modulate the carbon concentration as well to preserve a lattice parameter identity.

During the thermal oxidation step, oxidation of securing areas 11 also takes place and this parameter therefore has to be taken into account to prevent too great a consumption of the securing areas by a silicon oxide.

Furthermore, the use of silicon-germanium-carbon alloy target layers 1, 7 is not incompatible with fabrication of germanium nanowires. It has in fact been discovered that, when oxidation of a silicon-germanium-carbon alloy film takes place, the carbon reacts with the oxygen and disappears from the alloy. The nanowire obtained from a fully oxidized SiGeC film is therefore a pure germanium nanotube.

Advantageously, silicon-germanium alloy-base nanotubes do not comprise carbon atoms as the latter form clusters. These carbon atom clusters can be detrimental to transportation of charge carriers. Under these conditions, condensation of the silicon-germanium alloy film is complete to obtain a carbon-free nanotube. It is also possible to form a film of silicon-germanium alloy alone sandwiched between two silicon-germanium-carbon alloy films. It is then advantageous for the three films to have the same lattice parameter, i.e. different germanium concentrations to take account of incorporation of carbon in the two external films of the sandwich.

It has also been discovered that, unlike what was expected, oxidation of the target layer to transform the target layer into a nanowire 8 does not result in deformation of the nanowire. Indeed, when condensation of the germanium takes place from the target layer to the nanowire, there is an increase of the germanium concentration and therefore of the lattice parameter. Deformation of the beam and of the future nanowire is therefore expected in the thermal oxidation step, however the silicon oxide formed around target layer 1, 7 prevents any deformation. Obtaining a non-deformed target layer 1, 7 in the connecting area therefore results, after the thermal oxidation step, in a nanowire keeping a longitudinal axis parallel to the main surface of the substrate.

Figure 11:
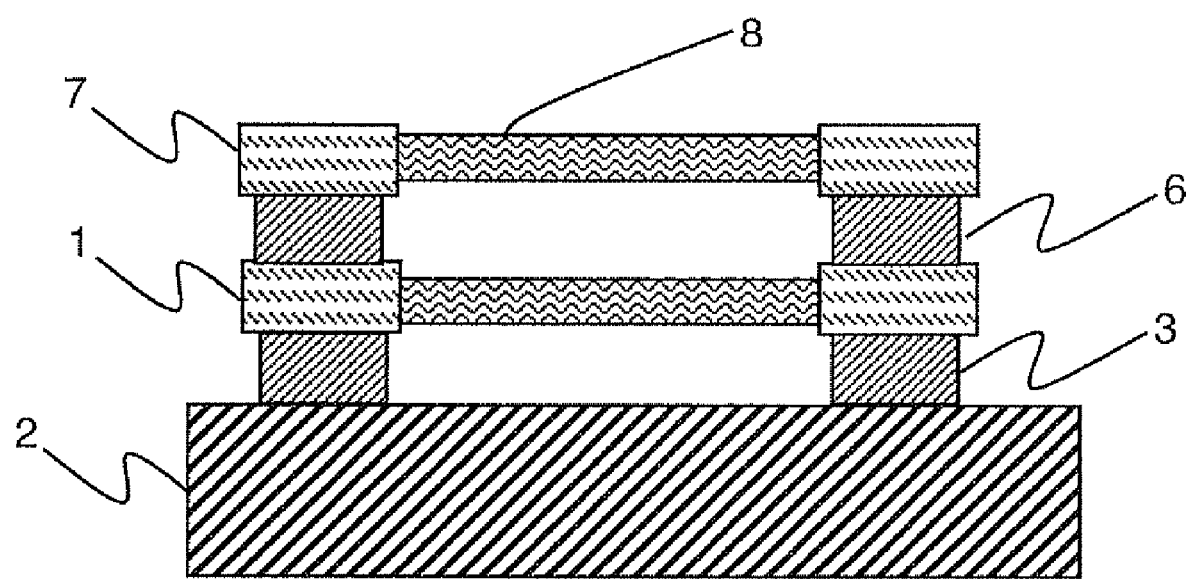
FIG. 11 represents suspended nanowires according to the invention in schematic manner, in longitudinal cross-section.

As illustrated in FIG. 11, the method described above enables nanowires 8 parallel to the surface of substrate 2 to be obtained. These nanowires are kept in suspension by means of securing areas 11 and the vertical distance between two nanowires is defined by the thickness of silicon film 6 which is comprised between the two corresponding target layers 1 and 7.

The invention claimed is:

1. Method for forming one suspended nanowire made from germanium-base single-crystal material, successively comprising:
   providing of a substrate comprising a first silicon layer covered by a target layer made from a silicon-germanium alloy-base material,
   forming one suspended beam in the target layer, wherein, in a plane parallel to a main surface of the substrate, the lattice parameter of the first silicon layer is identical to the lattice parameter of the material constituting the suspended beam, after said first silicon layer has been eliminated,
   oxidizing thermally the suspended beam so as to form said nanowire, in the place of the suspended beam, by condensation of the germanium atoms.

2. Method according to claim 1, wherein the target layer comprises carbon atoms.

3. Method according to claim 2, wherein the germanium concentration in the target layer is ten times greater than the carbon concentration.

4. Method according to claim 1, wherein the first silicon layer is tensile stressed in a plane parallel to the main surface of the substrate.

5. Method according to claim 1, wherein the substrate is a silicon-on-insulator substrate, the first silicon layer being arranged directly on a dielectric material.

6. Method according to claim 1, wherein the substrate comprises at least one additional target layer and one additional silicon layer, the substrate comprising an alternation between the target layers and said silicon layers.

7. Method according to claim 6, wherein the target layer and the additional target layer comprise different germanium and carbon concentrations.

8. Method according to claim 6, wherein forming of the suspended beam is achieved by patterning the target layers and silicon layers to form a three-dimensional pattern having, in a plane parallel to a main surface of the substrate, at least two securing areas connected to one another by at least one connecting area and by elimination of the first silicon layer in the connecting area.

9. Method according to claim 8, wherein the three-dimensional pattern comprises a plurality of connecting areas.

10. Method according to claim 8, wherein, in a transverse direction, the connecting area presents a smaller dimension than the longitudinal and transverse dimensions of the securing areas, the securing areas and connecting area being formed by the same materials.

* * * * *